United States Patent
Etheridge et al.

(10) Patent No.: US 6,847,905 B2
(45) Date of Patent: Jan. 25, 2005

(54) ARCHITECTURE PROVIDING INCREASED INFORMATION DISPLAY FOR LONG ACQUISITIONS OR CONSTRAINED MEMORY BANDWIDTH

(75) Inventors: Eric P. Etheridge, Beaverton, OR (US); Kevin T. Ivers, Woodland, WA (US); Forrest A. Edwards, Wilsonville, OR (US); Paul M. Gerlach, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 39 days.

(21) Appl. No.: 10/366,046

(22) Filed: Feb. 12, 2003

(65) Prior Publication Data

US 2004/0008160 A1 Jan. 15, 2004

Related U.S. Application Data

(60) Provisional application No. 60/356,879, filed on Feb. 12, 2002.

(51) Int. Cl.$^7$ ............................. G01R 13/00; G06F 15/00
(52) U.S. Cl. ............................................. 702/67; 702/70
(58) Field of Search .................................. 382/168, 170, 382/171, 173; 324/76.12, 76.13, 76.15, 76.16; 702/66–68, 70, 79

(56) References Cited

U.S. PATENT DOCUMENTS

| | | | | |
|---|---|---|---|---|
| 3,983,320 A | * | 9/1976 | Ketcham et al. | 348/672 |
| 5,396,582 A | * | 3/1995 | Kahkoska | 358/1.3 |
| 5,495,168 A | * | 2/1996 | de Vries | 324/121 R |
| 5,594,655 A | * | 1/1997 | Berchin | 702/77 |
| 5,793,642 A | * | 8/1998 | Frisch et al. | 703/4 |
| 6,151,559 A | * | 11/2000 | Williams | 702/58 |
| 6,502,045 B1 | * | 12/2002 | Biagiotti | 702/66 |

* cited by examiner

*Primary Examiner*—Marc S. Hoff
*Assistant Examiner*—Paul Kim
(74) *Attorney, Agent, or Firm*—Thomas F. Lenihan; Moser, Patterson, Sheridan, LLP; Francis I. Gray

(57) ABSTRACT

A method and apparatus for rasterizing a digital sample stream by producing histograms for each of a plurality of time slices forming a display frame. Time slice histograms for at least one display frame are stored in a circular memory buffer and provided to a display raster for display. The first time slice displayed optionally comprises that time slice temporally associated with a trigger condition.

21 Claims, 3 Drawing Sheets

ARCHITECTURE PROVIDING INCREASED INFORMATION DISPLAY FOR LONG ACQUISITIONS OR CONSTRAINED MEMORY BANDWIDTH

CROSS-REFERENCE TO RELATED APPLICATION

This application claims the benefit of commonly owned provisional patent application Ser. No. 60/356,879, filed Feb. 12, 2002, which is hereby incorporated by reference in its entirety.

FIELD OF THE INVENTION

The invention relates generally to signal acquisition instruments and, more specifically, to a method and apparatus for rapidly processing acquired data in a manner avoiding acquisition memory bandwidth limitations.

BACKGROUND OF THE INVENTION

Existing architectures for digital storage oscilloscopes (DSOs) and other test and measurement devices store acquired sample data within an acquisition memory, which is subsequently accessed by an acquisition rasterizer which produces waveform data suitable for use by a display raster memory associated with a display device. An example of such an architecture is depicted in U.S. Pat. No. 5,986,637 issued Nov. 16, 1999 to Etheridge et al. and incorporated herein by reference in its entirety.

These present architectures acquire data stored in an acquisition memory and, upon occurrence of a trigger event, the stored data is aligned to the triggering event and processed by an acquisition rasterizer. The resulting raster data is stored in a display raster memory for subsequent display on a display device.

Thus, the process of data acquisition must be complete prior to the process of rasterizing the acquired data. For long acquisitions, decimation is used to decrease the amount of data such that the data fits in available acquisition memory, which decimation inherently causes a loss of information. This loss of information has heretofore been deemed an acceptable tradeoff due to acquisition memory bandwidth limitations.

SUMMARY OF INVENTION

These and other deficiencies of the prior art are addressed by the present invention. Specifically, in an embodiment of the invention, a signal under test (SUT) is digitized and otherwise acquired to produce a resulting stream of samples that are coupled directly to an acquisition rasterizer, rather than an acquisition memory. The acquisition rasterizer operates to process the stream of samples to produce histograms for each of a plurality of time slices forming a display frame. Time slice histograms for at least one display frame are stored in a circular memory buffer and provided to a display raster for display. The first time slice displayed optionally comprises that time slice temporally associated with a trigger condition.

A digital oscilloscope according to an embodiment of the invention comprises an analog to digital converter for digitizing a signal under test (SUT) to provide a stream of digital samples representing amplitude values of the SUT over time; an acquisition rasterizer, for generating a histographic representation of sample values within each of a plurality of time slices; a circular raster acquisition memory, for storing a plurality of time slice histograms to form thereby a stored frame of time slice histograms; and a display raster memory, for periodically receiving a frame of time slice histograms to provide thereby image frames suitable for use by a display device.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

The subject invention will be primarily described within the context of test and measurement devices such as digital storage oscilloscopes (DSOs). However, it will be appreciated by those skilled in the art that the invention may be advantageously employed in any environment where one or more signal acquisition devices operate to acquire signals under test for subsequent display. While the invention finds great utility within the context of relatively slow data presentation rates, the invention is equally applicable to high data presentation rates and data acquisition systems in which large amounts of sample data are processed.

Figure 1:
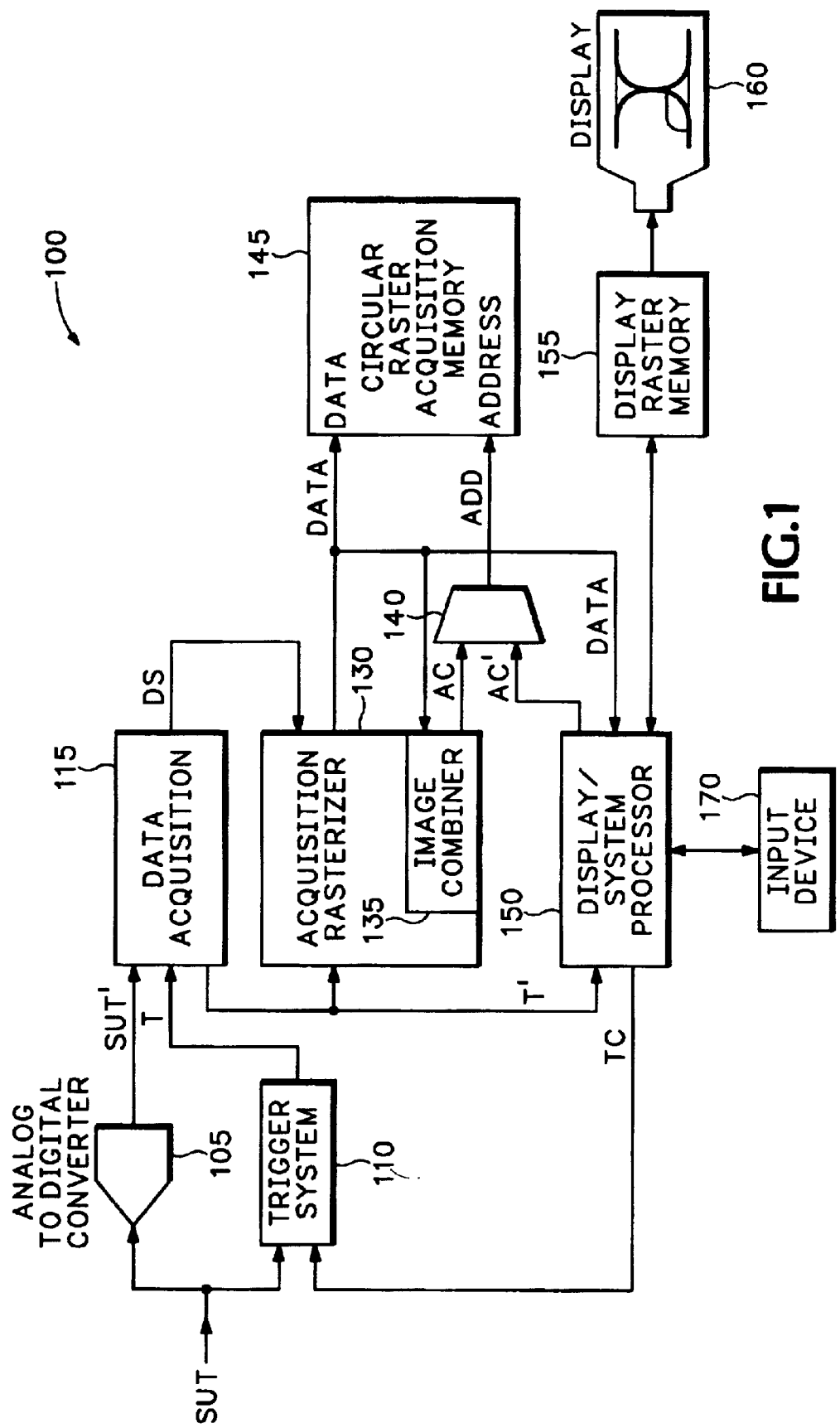
FIG. 1 depicts a high level block diagram of a signal acquisition system according to an embodiment of the invention.

FIG. 1 depicts a high level block diagram of a signal acquisition system according to an embodiment of the present invention. The data acquisition system 100 of FIG. 1 receives and processes a signal under test (SUT) to generate thereby a waveform representation of the SUT on a display device. It will be appreciated by those skilled in the art that while a single input channel is shown in FIG. 1 and discussed herein, multiple input channels may also be implemented within the context of the present invention.

The signal acquisition device 100 of FIG. 1 comprises an analog-to-digital (A/D) converter 105, a trigger system 110, a data acquisition circuit 115, an acquisition rasterizer 130 which optionally includes an image combiner 135, an address multiplexer 140, a raster acquisition memory 145, a display/system processor 150, a display raster memory 155, a display device 160 and an input device 170.

The A/D converter 105 receives and digitizes a signal under test (SUT) in response to a sample clock signal (not shown) to produce a stream of digital samples SUT'. The sample clock signal is preferably a clock signal adapted to cause the A/D converter 105 to operate at a maximum sampling rate, though other sampling rates may be used. For simplicity of the discussion, the AND converter will be primarily described as an 8-bit A/D converter operating at a sample rate of 2.5 billion samples per second. These parameters may easily be changed depending on the desired application.

The stream of samples SUT' produced by the A/D converter 105 is coupled to the data acquisition circuit 115. The data acquisition circuit 115 comprises, illustratively, a decimator which optionally processes the stream of samples SUT' received from the A/D converter 105 according to a respective processing algorithm or decimation mode, such as a sub-sampling mode, a peak detection mode (e.g., min-max detection), a high resolution mode (e.g., a box-car averaging mode) or other mathematical function, algorithm or mode or a "pass through" mode in which no decimation or sample reduction is performed. The decimation mode of the data acquisition circuit 115 may be preprogrammed such as with an application specific integrated circuit (ASIC), or may be programmed "on the fly" in response to a control signal (not shown) provided by, for example, the display/system processor 150. The data acquisition circuit produces a stream of decimated samples DS that is coupled to the acquisition rasterizer 130. The generation of the decimated sample stream DS is performed in response to the trigger signal T produced by the trigger signal 210.

The trigger system 110 asserts a trigger signal T in response to the detection of an analog triggering function or condition such as a rising edge, falling edge, specific pulse width and/or runt triggering condition and the like within the signal under test SUT. The trigger signal T is utilized by the data acquisition circuit 115 to responsively process at least that portion of the stream of samples SUT' temporally proximate the asserted trigger signal T. For example, the data acquisition circuit 115 may provide to the acquisition rasterizer 130 a decimated sample stream comprising samples acquired at or before the time of trigger assertion (pre-trigger samples), as well as samples acquired following the trigger assertion.

The invention supports trigger hold-off periods including pre-trigger and post-trigger hold-off periods, as well as other temporal offsets which may be employed to modify the trigger behavior of the data acquisition circuit 115.

In the case of a trigger hold-off condition (pre-trigger hold-off), the time slice stored in an initial portion of display raster memory (i.e., the portion associated with an initial display region, typically the left edge of a display frame) comprises a time slice temporally preceding the triggering event, where the amount of temporal offset corresponds to the trigger hold-off period. In the case of a trigger advance condition (post-trigger hold-off), the time slice stored in the initial portion of the display raster memory comprises a time slice temporally following the triggering event, where the amount of temporal offset corresponds to a post-trigger hold-off period.

The trigger system 110 is optionally responsive to a trigger control signal TC produced by the display/system processor 150 to modify trigger conditions and/or hold-off periods. The data acquisition circuit 115 optionally produces a trigger indication signal T' that indicates which sample or sample group is temporally proximate the trigger condition detected by the trigger system 110.

The acquisition rasterizer 130 receives the decimated sample stream DS produced by the data acquisition system 115. As previously noted, the decimated sample stream may be decimated according to one or more of a plurality of decimation functions, including a pass-through function in which the sample stream initially produced by the A/D converter 105 is provided to the acquisition rasterizer 130. The acquisition rasterizer processes the decimated sample stream DS to produce histographic data representing the sample value distribution of the samples associated with each of respective pluralities of time slices forming respective display frames. The histographic representations of the acquired SUT time slices are then stored in the raster acquisition memory 145.

A counter function suitable for generating time slice based histographic data will be discussed in more detail below with respect to FIG. 3. A data structure suitable for representing the histographic data generated by the acquisition rasterizer 130 will be discussed below in more detail with respect to FIG. 4.

The optional image combiner 135 within the acquisition rasterizer 130 combines the histographic representations of multiple raster images to produce a composite raster image. The image combiner 135 may combine stored raster images with each other and/or stored raster images and presently acquired raster images.

The raster acquisition memory 145 comprises, illustratively, a circular memory buffer that operates in a read mode and a write mode. Within the context of the present invention, the raster acquisition memory 145 receives data for storage from the acquisition rasterizer 130 and provides stored data to the image combiner 135 and/or the display/system processor 150. In a write mode of operation, data present on an input data line DATA is stored in an address indicated via an input address line ADD. In a read mode of operation, data stored within an address indicated via the address line ADD is produced at the data line DATA. The acquisition rasterizer 130 provides an address control signal AC to an address multiplexer 140. The display/system processor 150 provides an address control signal AC' to the address multiplexer 140. The address multiplexer 140 selects the appropriate address control signal AC, AC' to provide to the raster acquisition memory 145 as the address signal ADD.

The raster acquisition memory 145 is primarily described within the context of a circular memory buffer. The use of a circular memory buffer advantageously provides a pre-trigger "view" of the samples stored therein. If no pre-trigger view is necessary or desired, then decimation may be initiated upon occurrence of a trigger condition. Therefore, where pre-trigger views are not necessary the raster acquisition memory may be architected as a non-circular memory buffer (i.e., a standard or linear memory buffer).

The display/system processor 150 is used to manage the various operations of the signal acquisition system 100. For example, the display/system processor 150 generates the trigger control signal TC used to control the trigger system 110. The display/system processor 150 receives user commands via the input device 170, illustratively a keypad, pointing device or touch screen input.

The display/system processor 150 extracts raster image data from the acquisition rasterizer 130, image combiner 135 and/or raster acquisition memory 145. The extracted raster image data is then stored in the display raster memory 155 to produce waveform imagery on the display device 160. The display raster memory 155 is updated with new raster data at a rate sufficient to provide a display image refresh rate such that displayed waveform data, eye diagrams and the like are perceived by a viewer as occurring in substantially real time.

The data stored within the display raster memory 155 is used to generate image frames upon the display device 160, illustratively a cathode ray tube (CRT), liquid crystal display (LCD) or other display device. The display device 160 may also comprise a touch screen device such that the display device provides both user input and user output functionality.

The display/system processor 150 and/or the acquisition rasterizer 130 receive the trigger indication signal T' produced by the data acquisition circuit 115 in response to the occurrence of a trigger condition or event. In this manner, these subsystems are able to temporally align a plurality of histographic waveform representations, such as waveform representations stored in the raster acquisition memory 145 and/or presently processed waveform representations being generated by the acquisition rasterizer 130.

Figure 2:
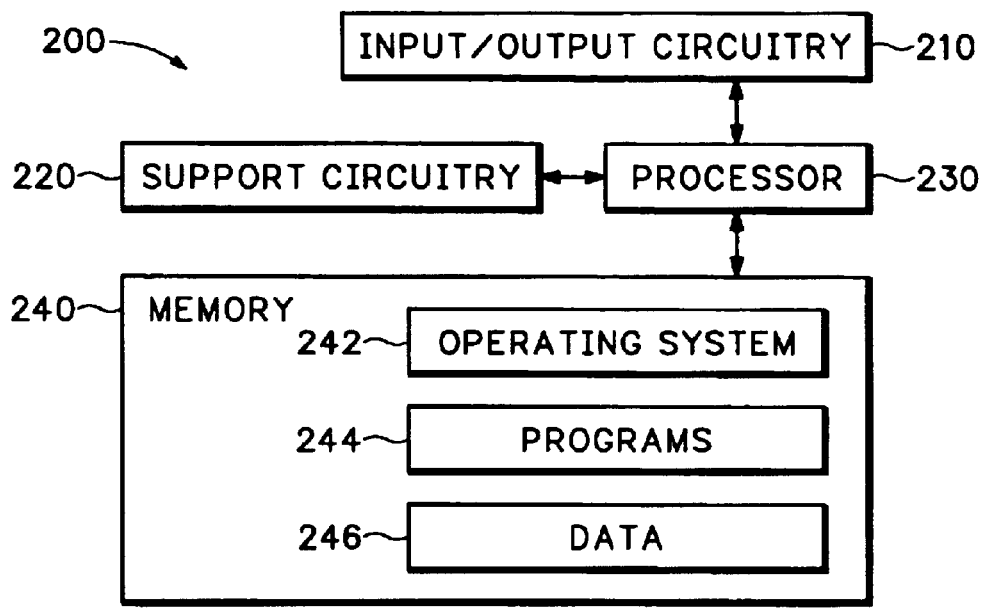
FIG. 2 depicts a high level block diagram of a controller suitable for use in the signal acquisition system of FIG. 1.

FIG. 2 depicts a high level block diagram of a controller suitable for use in the signal analysis system of FIG. 1. Specifically, the controller 200 of FIG. 2 may be employed to implement functions of the display/system controller 150. The controller 200 may also be used to implement various functions within the system 100 of FIG. 1 either individually or in any combination.

The controller 200 of FIG. 2 comprises a processor 230 as well as memory 240 for storing various control programs and other programs 244 and data 246. The memory 240 may also store an operating system 242 supporting the programs 244, such as the Windows® operating system manufactured by Microsoft Corporation of Redmond, Wash. Other operating systems, frameworks and environments suitable for performing the tasks described herein will also be appreciated by those skilled in the art and informed by the teachings of the present invention. For example, the Apple® Macintosh® operating systems, the various Unix-derived operating systems and the like also support functions including data retrieval and display functions useful in practicing the present invention.

The processor 230 cooperates with conventional support circuitry such as power supplies, clock circuits, cache memory and the like as well as circuits that assist in executing the software routines stored in the memory 240. As such, it is contemplated that some of the steps discussed herein as software processes may be implemented within hardware, for example as circuitry that cooperates with the processor 230 to perform various steps. The controller 200 also contains input/output (I/O) circuitry 210 that forms an interface between the various functional elements communicating with the controller 200. Although the controller 200 is depicted as a general purpose computer that is programmed to perform various control functions in accordance with the present invention, the invention can be implemented in hardware as, for example, an application specific integrated circuit (ASIC) or field programmable gate array (FPGA). As such, the process steps described herein are intended to be broadly interpreted as being equivalently performed by software, hardware or a combination thereof.

Figure 3:
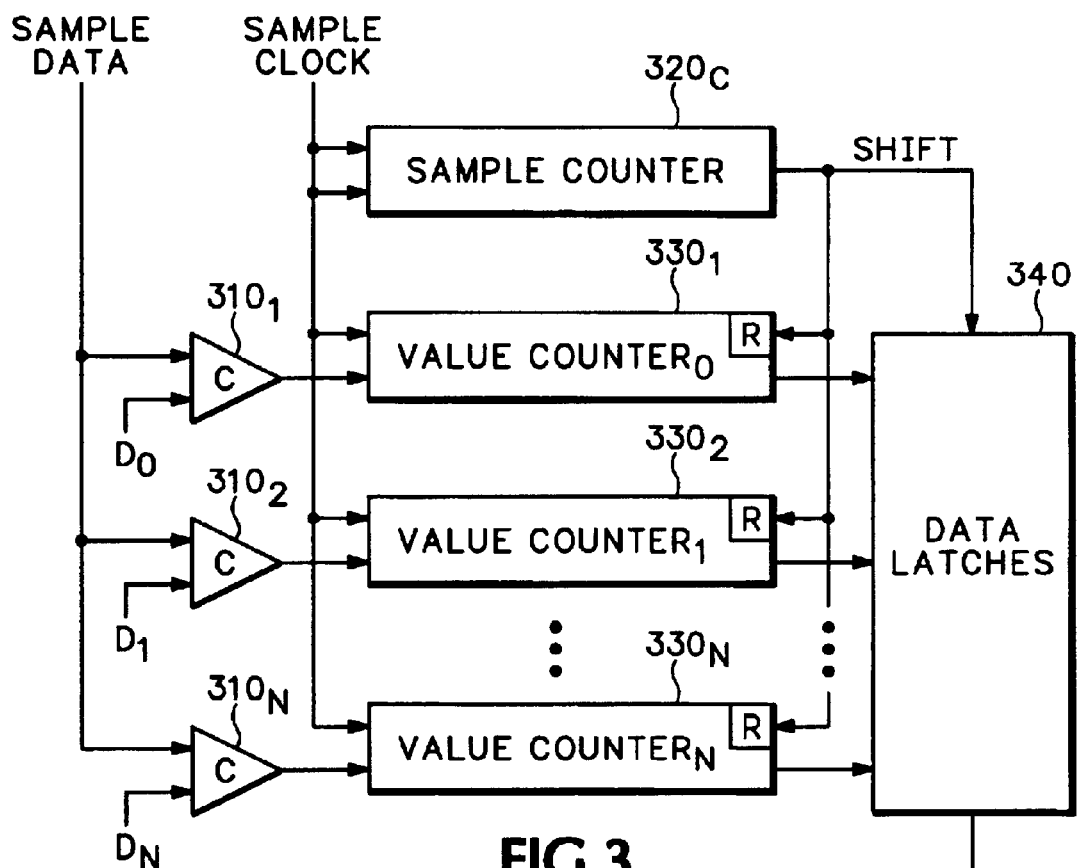
FIG. 3 depicts a functional representation of counter logic suitable for use in the signal acquisition system 100 of FIG. 1.

FIG. 3 depicts a functional representation of counter logic suitable for use in the system 100 of FIG. 1. Specifically, FIG. 3 only depicts a counter logic function suitable for implementing a portion of the functionality of the acquisition rasterizer 130. The depicted portion of the acquisition rasterizer may be implemented using conventional techniques by those skilled in the art and informed by the teachings of the present invention.

The counter logic function comprises a plurality of digital comparators $310_1$ through $310_N$ (collectively digital comparators 310), a sample counter 320, a plurality of value counters $330_1$ through $330_N$ (collectively value counters 330) and a data latch circuit 340.

Each of the digital comparators $310_1$ through $310_N$ receives a common data signal SAMPLE DATA (i.e., a sample to be examined) and a respective value level signal $D_1$ through $D_N$. Each digital comparator 310 provides to a corresponding value counter 330 a logic output signal of a known level or edge (e.g., a logic one or positive edge) in response to a favorable comparison of its respective value level signal D and the common data signal SAMPLE DATA.

The value counters 330 are incremented in response to each favorable comparison to count, thereby, the occurrences of sample levels of corresponding values. The value counters 330 provide their count values to the data latch circuit 340. In the examples described herein, the 8-bit A/D converter results provides that N=256.

The sample counter 320 is incremented in response to the arrival of a new sample. When the sample counter is incremented to a predetermined threshold level (e.g., the number of counts associated with a single time slice), it asserts a logic output signal SHIFT at a known level or edge (e.g., a logic one or positive edge) to each of the value counters 330 and latch circuit 340.

In response to assertion the output signal SHIFT produced by the sample counter 320, the latch circuit forward the present value counts to the raster acquisition memory 145 and the value counters 330 are reset to zero. This process is continually repeated for each time slice. In the case of user adjustment of the sweep rate or display duration, the reset count value associated with the sample counter is adjusted to conform to the number of samples associated with a time slice of the display.

Thus, the acquisition rasterizer 130 operates to produce a histographic representation of each time slice of the digitized SUT sample stream. As noted herein and below with respect to FIG. 5, each displayed image frame on a display device (e.g., an oscilloscope display) comprises a plurality of sample values displayed as a function of the time slice within which they occur and having a pixel luminance level (and/or chrominance level) that is selected according to the relative number of identical sample values present in the time slice. Briefly, the present invention provides luminance modulation of pixels associated with respective values in a time slice in response to the sample density of the respective value within the sample stream portion associated with the time slice.

Figure 4:
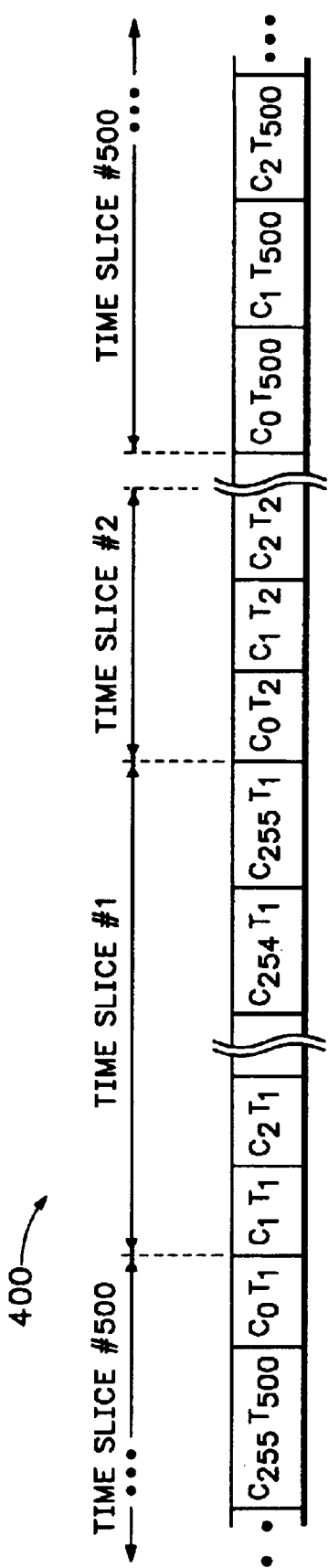
FIG. 4 depicts a block diagram of a data structure suitable for use in the present invention.

FIG. 4 depicts a block diagram of a data structure suitable for use in the present invention. Specifically, the data structure 400 of FIG. 4 represents histographic data generated by the acquisition rasterizer 130, and stored in the raster acquisition memory 145 and display raster 155 of the system 100 of FIG. 1.

Referring to FIG. 4, a first time slice denoted as time slice #1 is represented by fields $C_0T_1$, $C_1T_1$, $C_2T_1$, and so on up to $C_{255}T_1$; a second time slice denoted as time slice #2 is represented by fields $C_0T_2$, $C_1T_2$, $C_2T_2$, and so on up to $C_{255}T_2$; and so on up until a $500^{th}$ time slice denoted as time slice #500 is represented by fields $C_0T_{500}$, $C_1T_{500}$, $C_2T_{500}$, and so on up to $C_{255}T_{500}$. It will be appreciated that more or fewer time slices may be used depending on the display device employed.

Each of the time slice fields stores a count of the occurrence within the time slice of digital samples having each particular amplitude value, as indicated by the subscript associated with the defining C. In this example, the values of zero, one, two and so on up to 255 are used since it is assumed that the A/D converter 105 comprises an 8-bit A/D converter. In the case of lower (e.g., 4-bit) or higher (e.g., 12-bit) A/D converters, the data structure 400 of FIG. 4 is modified to include an increased number of sample value fields for each time slice.

The data structure 400 of FIG. 4 is depicted as including a single frame of 500 time slices where the last field of slice

500 is adjacent to the first field of slice #1. In various embodiments of the invention, more or fewer time slices may be used to represent a frame, and more frames may be simultaneously stored. For example, in the case of a multiple channel oscilloscope the acquisition rasterizer processes multiple acquired sample streams to provide corresponding histographic data for the time slices forming each of multiple frame. Where, illustratively, four channels are processed, the raster acquisition memory will store the time slices of each of the four frames. The time slices of the various frames may be interleaved to form a slotted time slice storage structure, or the frames may be stored adjacent to each other to form a slotted frame storage structure. The frames may also be composited by the image combiner 135 to produce a single composite frame for storage.

Figure 5:
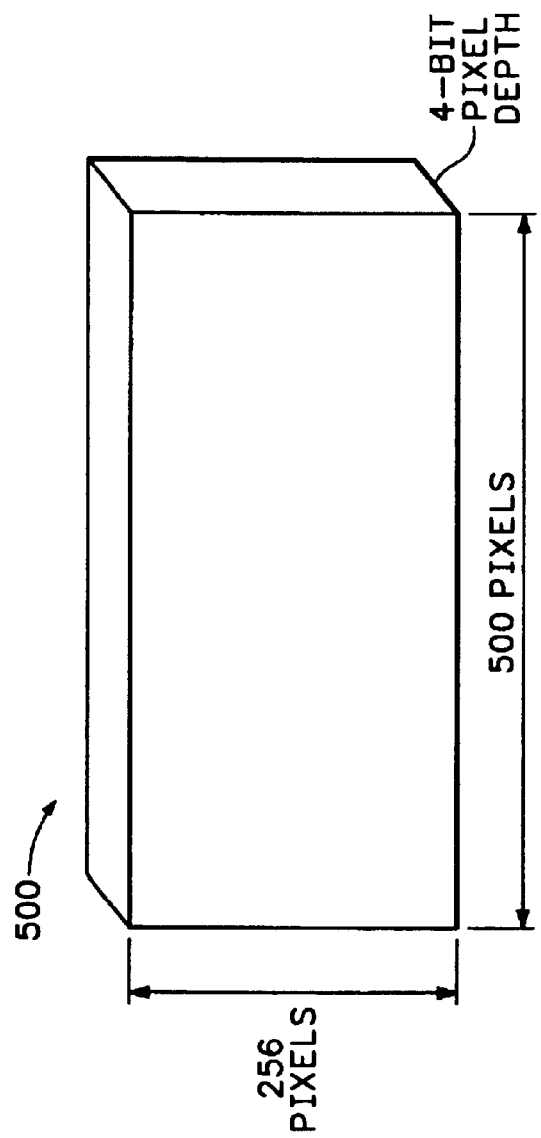
FIG. 5 graphically depicts an exemplary display image structure useful in understanding the present invention.

FIG. 5 graphically depicts an exemplary display image structure useful in understanding the present invention. The display image comprise a picture element (pixel) grid formed using a time slice axis and an amplitude axis. Conventionally, the time slice axis comprises the horizontal axis and the amplitude axis (e.g., voltage) comprises the vertical axis. Each pixel within the display image has illustratively associated with it a 4-bit pixel depth. That is, the luminance and or chrominance of a pixel is adapted according to a 4-bit word associated with the pixel. For purposes of this discussion, it will be assumed that each pixel uses all four bits to set an intensity level (i.e., luminance only) wherein a value of zero is a zero intensity condition (i.e., off) and a value of 15 is a full intensity condition (i.e., full brightness). Those pixels within a given time slice having the most value occurrences will be displayed at a higher intensity than those having the lowest (or no) occurrences.

The number of occurrences of sample values are optionally normalized by either the acquisition rasterizer 130 or display/system processor 150 to the available pixel intensity (or chrominance) levels such that the full dynamic range of the intensity levels (e.g., 4-bits) is utilized. Moreover, it will be appreciated that the number of pixel values representing each time slice does not need to be equal to the number of values provided by the A/D converter. That is, the dynamic range of the sample values may also be normalized to the dynamic range of the available amplitude pixels.

In one embodiment of the invention, an alternate bits per pixel reduction method is employed. Specifically, commonly assigned U.S. Pat. No. 6,057,853 issued May 2, 2000 and is herein incorporated by reference in its entirety. In the '853 patent, methods for mapping many bits-per-pixel intensity information into a fewer bits-per-pixel format are provided. The '853 patent provides a controllable transfer function that provides multiple viewing capabilities to an operator of, for example, an oscilloscope. The bits per pixel reduction methods includes, for example, a particular maximum pixel associated with a given image frame multiplied by a scale or other transfer function to create actual break point values of a larger range of pixel values, which subsequently are reduced to a single pixel intensity value for display. The scale or other transfer function(s) is optionally affected by user control.

The pixel grid of FIG. 5 illustratively comprises a 500 time slice pixels by 256 amplitude pixels to form thereby a display image. The number of samples associated with any one time slice is proportionally to the effective sample rate of the samples received by the acquisition rasterizer and the desired display setting by the oscilloscope operator. For example, if display duration (sweep speed) is one second per displayed frame and the effective sample rate is 2.5 GigaSamples per second, then the number of samples associated with each of the 500 time slices is 5,000,000 samples. Similarly, if the duration (sweep speed) is 1 millisecond per displayed frame, then the number of samples associated with each of the 500 time slices is 5,000 samples.

The above-described invention advantageously operates to rapidly process a digital sample stream directly provided by an A/D converter (i.e., no intermediate storage of samples within an acquisition memory) to produce histographic representations for each time slice of a frame as the time slice occurs. The time slice histograms for at least one display frame are stored in a circular memory buffer and provided to a display raster for display. The first time slice displayed optionally comprises that time slice temporally associated with a trigger condition.

In one embodiment of the invention, the raster acquisition memory is used to store a plurality of histogram frames. For example, the stored histogram frames may comprise temporally offset histogram frames provided by a single input channel and/or histogram frames provided by each of a plurality of input channels. The image combiner may combine stored histogram frames from each of the plurality of input channels to form thereby a multiple channel histogram frame suitable for storage in the display raster memory for subsequent display. As previously noted, where a pre-trigger view is not needed, a first in first out (FIFO) memory may be used to begin storing time slices associated with multiple histogram frames within the raster acquisition memory. It is noted that the time slices may be stored in a time interleaved manner or a frame interleaved manner. It is further noted-that the multiple frame histogram storage may also be implemented using a circular memory buffer. For example, in one embodiment of the invention a circular memory buffer accommodating four histogram frames is utilized to support thereby a pre-trigger view of four input channels.

In one embodiment, the acquired data is further processed to produce a vector representation of the underlying digitized SUT. For example, rather than processing the acquired data to form a dot mode histographic representation, the acquired data is processed to provide a vector mode histographic representation. In one embodiment, such a vector representation is provided by incrementing counters between a current sample value and a previous sample value. For example, a comparator used to increment a counter is provided with two samples and, if the samples compare favorably (e.g., if the position of the comparator is between the value of the present sample and the value of the previous sample) the corresponding counter is incremented. Those skilled in the art and informed by the teachings of the present invention will appreciate that the vector representation discussed herein may be implemented using the above-described counter incrementing algorithm or other algorithms known to those skilled in the art.

In one embodiment, the invention is utilized within the context of a DSO to provide signal processing capabilities such that the user experience with the DSO (in terms of input and waveform presentation response) is similar to that of prior analog oscilloscopes.

The invention also comprises a new type of decimation function. Specifically, the sample rate of a stored (or received) sample is reduced in the manner described above by generating a histographic representation of sample data within each time slice of an image frame. In this manner, significant detail about a sample set is retained while reducing the size of the underlying sample set. The method of the present invention is particularly advantageous within the context of the large sample sets (e.g., millions or billions of samples) such as found during a very long duration record or a very high sample rate acquisition.

While the foregoing is directed to the preferred embodiment of the present invention, other and further embodiments of the invention may be devised without departing from the basic scope thereof, and the scope thereof is determined by the claims that follow.

What is claimed is:

1. A method comprising:

digitizing a signal under test (SUT) to provide a stream of digital samples representing amplitude values of said SUT over time; and temporally segmenting said sample stream into a plurality time frames, each of said plurality of time frames comprising a plurality of time slices, each of said time slices comprising a plurality of amplitude values; and counting the number of occurrences of each amplitude value within the digital samples associated with each time slice of each time frame to provide a histographic representation of amplitude values for each time slice of each time frame.

2. The method of claim 1, further comprising:

periodically storing histographic representations of each time frame in a raster memory adapted to enable the generation of a corresponding image frame on a display device.

3. The method of claim 2, wherein:

said image frame comprising a two dimensional picture element (pixel) grid defined by a time slice axis and an amplitude value axis, each time slice representing a time axis pixel and each amplitude value representing an amplitude axis pixel; and wherein each pixel within said pixel grid having at least one of an intensity parameter and a color parameter adapted in accordance with a corresponding histographic value level.

4. The method of claim 3, wherein:

said image frame has a time slice axis defined by a duration parameter and an amplitude value axis defined by a range of amplitude values provided by said stream of digital samples.

5. The method of claim 4, wherein:

user interaction to adjust said duration parameter results in an adjustment in the number of digital samples associated with each time slice.

6. The method of claim 1, further comprising:

storing, in a circular raster acquisition memory, the histographic representation of amplitude values for each time slice of at least one time frame.

7. The method of claim 6, further comprising:

copying, from said raster acquisition memory to a raster display memory, the histographic representation of amplitude values for each time slice of one time frame.

8. The method of claim 7, wherein said step of copying comprises:

identifying a time slice within said circular raster acquisition memory temporally proximate a triggering event; and copying said identified time slice into a first time slice portion of said raster display memory and remaining time slices into remaining portions of said raster display memory.

9. The method of claim 7, wherein said step of copying comprises:

identifying a time slice within said circular raster acquisition memory temporally offset by a predetermined period of time from a triggering event; and copying said identified time slice into a first time slice portion of said raster display memory and remaining time slices into remaining portions of said raster display memory.

10. The method of claim 1, further comprising:

storing, in a first in first out (FIFO) raster acquisition memory, the histographic representation of amplitude values for each time slice occurring after a triggering event.

11. The method of claim 1, further comprising:

digitizing a second signal under test (SUT) to provide a second stream of digital samples representing amplitude values of said second SUT over time; and temporally segmenting said second sample stream into a second plurality of time frames, each of said second plurality of time frames comprising a plurality of time slices, each of said time slices comprising a plurality of amplitude values; and counting the number of occurrences of each amplitude value within the digital samples associated with each time slice of each time frame to provide a histographic representation of amplitude values for each time slice of each time frame of said second SUT.

12. The method of claim 11, further comprising:

periodically storing histographic representations of each of said second plurality of time frames in said raster memory.

13. The method of claim 12, further comprising:

combining a plurality of stored histographic frame representations to produce thereby a combined raster frame;

said combined raster frame being periodically stored in said raster memory.

14. The method of claim 12, wherein:

time slices associated with said first and second plurality of frames are stored in said raster acquisition memory in a time slice interleaved manner.

15. The method of claim 12, wherein:

time slices associated with said first and second plurality of frames are stored in said raster acquisition memory in a frame interleaved manner.

16. A digital oscilloscope, comprising:

an analog to digital converter for digitizing a signal under test (SUT) to provide a stream of digital samples representing amplitude values of said SUT over time;

an acquisition rasterizer, for generating a histographic representation of sample values within each of a plurality of time slices;

a raster acquisition memory, for storing a plurality of time slice histograms to form thereby a stored frame of time slice histograms; and a display raster memory, for periodically receiving a frame of time slice histograms to provide thereby image frames suitable for use by a display device.

17. The oscilloscope of claim 16, further comprising:

an image combiner, for combining frames of time slice histograms to produce a combined frame of time slice histograms;

said display raster memory periodically receiving said combined time slice histograms to provide thereby combined waveform image frames suitable for use by said display device.

18. The oscilloscope of claim 16, further comprising:

a trigger circuit, for generating indicium of the occurrence of a triggering event; wherein:

initial time slices within said frame of time slices received by said display raster memory comprise those time slices temporally proximate said triggering event.

19. The oscilloscope of claim 18, wherein:

said raster acquisition memory comprises a circular memory for continually storing said plurality of time slice histograms.

20. The oscilloscope of claim 19, wherein:

in response to one of a trigger hold-off condition and a trigger advance condition, the time slice initially stored in the display raster memory comprises, respectively, a time slice temporally preceding said triggering event and a time slice temporally following said triggering event.

21. The oscilloscope of claim 17, wherein:

said raster acquisition memory stores a plurality of histogram frames, each of said histogram frames received via a respective input channel;

said image combiner operating to combine temporally aligned histogram frames from multiple channels.

* * * * *